INVENTOR.
Ralph L. Meyer
BY John J. Pederson
Attorney

March 24, 1959 R. L. MEYER 2,879,362

PHOTOSENSITIVE DEVICE

Filed Nov. 14, 1956 2 Sheets-Sheet 2

INVENTOR.
Ralph L. Meyer
BY John J. Pederson
Attorney

United States Patent Office 2,879,362

Patented Mar. 24, 1959

2,879,362

PHOTOSENSITIVE DEVICE

Ralph L. Meyer, Elgin, Ill., assignor to The Rauland Corporation, a corporation of Illinois Application November 14, 1956, Serial No. 622,063

13 Claims. (Cl. 201—63)

This invention is directed to photosensitive devices and to improvements in the art of manufacturing such devices. More particularly, the invention is concerned with photosensitive cells of the photoconductive type in which the photoconductor comprises sintered cadmium selenide, as well as with novel techniques for producing the photoconductive cell.

In general, it may be stated that there are several different known methods for manufacturing photosensitive cadmium-compound devices. In one process, the cadmium compound is evaporated onto a suitable substrate such as glass to form the desired photoconductive layer. Cadmium-compound photocells may also be fabricated by applying the photosensitive powder obtained by normal fluorescent powder manufacturing methods to a substrate; a binder for the powder may be required. Another conventional process for producing cadmium-compound photocells utilizes a technique of growing single crystals from a vapor phase; the individual cells comprise sections of a single crystal. In still another known method for preparing photoconductive cells, specially prepared cadmium-compound powder is sintered onto a suitable substrate. The single-crystal and sintered cells have generally a much higher sensitivity than cells produced by the first two processes.

Sintered cadmium-compound cells are a relatively recent development; very little descriptive material on the processing involved is available in the technical literature at this time. From a manufacturing standpoint, the sintering process is much preferable to the method requiring growth of single crystals, since the latter procedure is much more expensive and time consuming and must be critically controlled to achieve any useful degree of uniformity in cell characteristics. Furthermore, the size of the sensitive area is limited in the case of crystals whereas large area cells can be made by sintering techniques.

In a copending application of Serge Pakswer et al., Serial No. 588,517, filed May 31, 1956, and assigned to the same assignee as the present invention, there are described and claimed photosensitive cells of the photoconductive type in which the photoconductor comprises cadmium sulfide, cadmium selenide, or a mixture of the two, and with novel techniques for producing these photoconductive cells. The cadmium selenide cells are particularly preferred in applications where a high response in the red portions of the spectrum is desired. For some purposes, it has been found that the cadmium selenide cells produced in accordance with the process of that application have insufficient adherence to certain preferred substrates such as glass, principally because the sintering temperature for satisfactory adherence of cadmium selenide is above the melting point of such substrates.

It is an object of the invention, therefore, to provide a new and improved method of manufacturing photoconductive devices in which the photoconductive material comprises cadmium selenide.

It is another object of the invention to provide a method of manufacturing cadmium selenide photoconductive devices in which the adherence of the cadmium selenide to a supporting substrate is greatly improved.

It is still another object of the invention to provide a method of manufacturing improved cadmium selenide photocells which exhibit large sensitivity to radiation in the red portion of the spectrum.

A photosensitive impedance device is manufactured in accordance with the invention by coating a substrate with a material consisting primarily of cadmium sulfide. The thus coated substrate then is fired at a temperature above 650° C. for a period of time sufficient to sinter the cadmium sulfide coating to the substrate. The sintered coating is then coated with a photoconductor consisting primarily of cadmium selenide. The thus double-coated substrate again is fired at a temperature above 650° C. for a period of time sufficient to sinter the cadmium selenide coating to the cadmium sulfide coating and to develop photoconductive properties in the cadmium selenide coating. Two spaced conductive elements are applied to the photoconductor to form a pair of electrodes electrically interconnected by the sintered cadmium selenide coating.

The features of the present invention which are believed to be novel are set forth with particularity in the appended claims. The organization and manner of operation of the invention together with further objects and advantages thereof, may best be understood by reference to the following description taken in connection with the accompanying drawings, in the several figures of which like reference numerals identify like elements, and in which:

Pure cadmium selenide is an insulator and has a resistance of the order of $10^{12}$ ohm centimeters. In order to produce an impedance device capable of translating useful currents, the resistivity of the CdSe usually must be substantially decreased. The reduction in impedance may be accomplished by introducing into the insulator material donor impurities; these donor impurities comprise elements from the groups in the periodic system immediately adjacent and to the right of either of the two components of the insulator compound. In other words, since cadmium is in the second column of the periodic table and selenium is in the sixth column, donor impurities may be selected from the third and seventh columns of the periodic table. These donor impurities increase both the "dark" or unilluminated current and the photoconductive current which may be translated through the CdSe photoconductor.

Some other impurities, including copper, silver and manganese counteract the action of the donor impurities; they tend to decrease the "dark" conductivity and the photoconductivity of the material. These impurities, sometimes referred to hereinafter as "inhibitors" or "inhibitor impurities," also influence the decay time of the photoconductive current in the cell. In sintered cells of the type described hereinafter, both types of impurities may be employed conjointly to achieve the desired electrical characteristics in the finished cells. In most instances, chlorine is utilized as the donor impurity and copper is used as the inhibitor impurity.

Figures 1, 2:
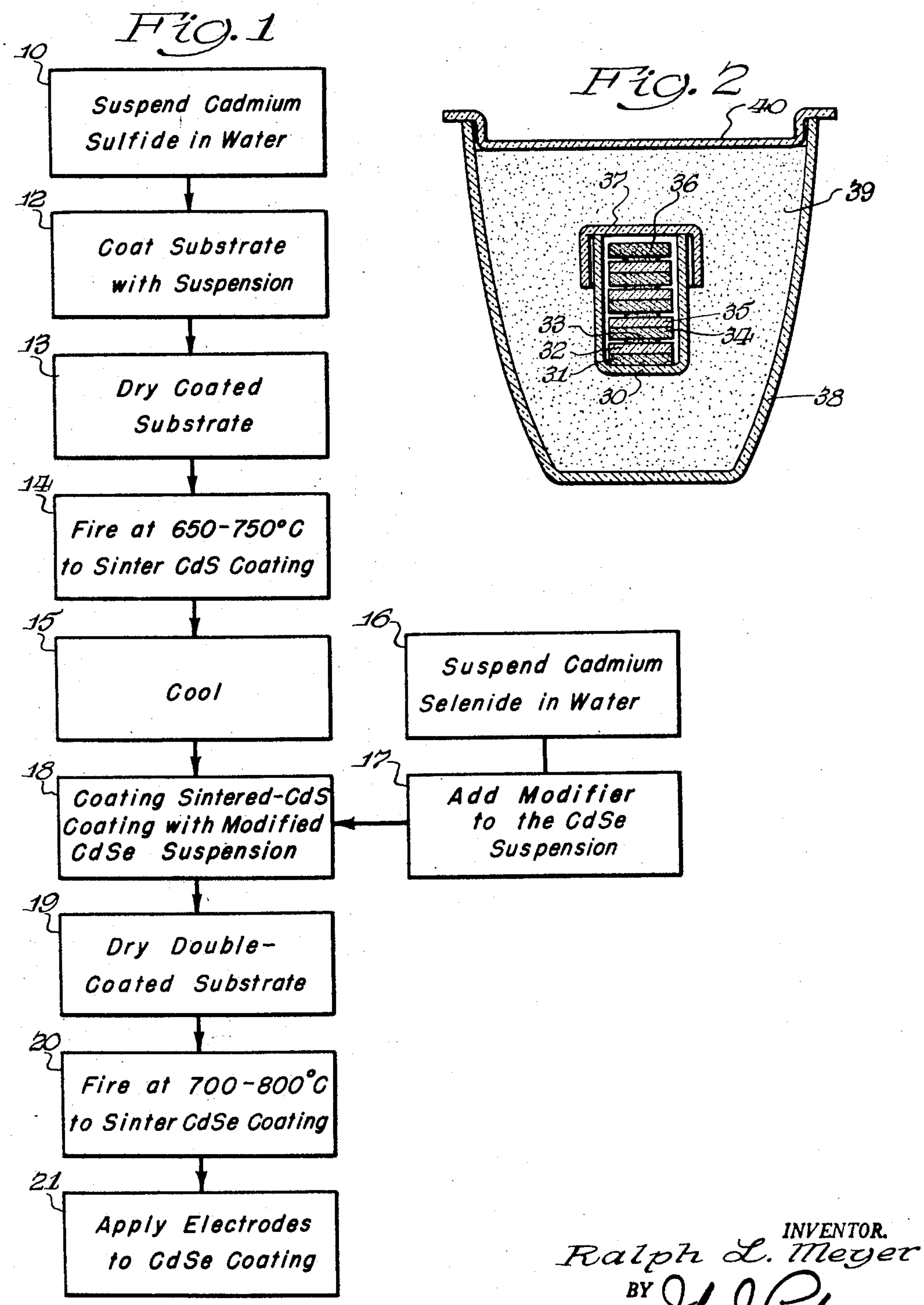
Figure 1 is a flow chart of one embodiment of the invention applicable to the manufacture of sintered photoconductive cells.
Figure 2 illustrates one form of apparatus which may be employed in the sintering processes of Figure 1.

The flow chart of Figure 1 illustrates the process steps in one embodiment of the invention in which cadmium selenide is utilized as the photoconductive material. In the first step of the process, indicated by reference numeral 10, cadmium sulfide powder is suspended in water to form a relatively thick slurry or paste. The suspension is then applied to a suitable substrate, usually glass, in step 12, and then dried in step 13. Application of the CdS suspension to the subtrate may be accomplished by painting, spraying, silk screening, or any equivalent technique. After being coated with the suspension and dried, the substrate is fired at a temperature within the range of 650 to 750° C. in step 14 to sinter the CdS coating and bond it to the substrate. After sintering, the device is cooled in step 15, preferably to a temperature approximating room temperature.

In a separate sequence of process steps, cadmium selenide powder is suspended in water, in step 16, to form a paste or slurry which preferably is then modified in step 17 by the addition of suitable donor and inhibitor impurities. The impurity content may, for example, comprise approximately $1\times10^{-3}$ gram chlorine per gram CdSe and $1\times10^{-3}$ gram copper per gram CdSe.

The modified CdSe suspension is then applied, in step 18, to the previously sintered CdS coating, dried in step 19, and fired in step 20 at a temperature within the range of 650 to 750° C. to sinter the CdSe coating to the CdS coating. Thereafter, the cells are cooled, two electrodes are applied, leaving a gap between the electrodes to form the desired photosensitive impedance (step 21), and suitable leads are connected to the electrodes.

In order to provide a more comprehensive picture of the invention and of the individual steps set forth above in connection with the flow chart of Figure 1, a detailed description of each of those steps for a typical process is set forth hereinafter. This material is presented solely by way of illustration and in no sense as a limitation upon the invention.

*Preparation of* CdS *suspension* (*step 10*)

The CdS suspension is prepared from a commercial grade precipitated CdS powder which has not been converted to fluorescent powder by the usual baking and crystallization procedures. Several different sources of supply for this material are available, including E. I. Du Pont de Nemours & Company and the New Jersey Zinc Company. The suspension should include sufficient water so that it will have the right consistency for the application technique selected. The suspended materials tend to settle out of the suspension; consequently, the suspension should be agitated vigorously before each use and should be kept in a closed container to prevent evaporation. In the event that some evaporation occurs, water may be added to bring the suspension back to the desired working consistency. Approximately the desired working consistency for brush painting may be obtained with about 2 cc. of water per gram of CdS powder, but this may be varied to provide the best consistency for any given coating technique.

*Coating of substrate* (*steps 12 and 13*)

In a typical cell structure, the substrate comprises a glass disc having a diameter of approximately 10.4 millimeters and a thickness of approximately 2.5 mm. The suspension prepared as indicated above is applied with a paint brush to the glass substrate in a strip approximately five millimeters wide extending completely across one face of the glass disc. After the CdS coating has been applied, the discs are dried in air at approximately 100° C. and are then ready for sintering. The drying temperature is not critical.

*Sintering of* CdS *coating* (*step 14*)

The firing process employed to sinter the CdS coating to the glass substrate is in some respects similar to standard procedures employed in the manufacture of fluorescent CdS powder. In this procedure, the firing of the CdS coating is carried out in an atmosphere largely governed by the presence of additional CdS powder. The firing crucible is more completely described hereinafter in connection with Figure 2, but at this juncture it is sufficient to say that the coated discs are preferably mounted within an enclosed crucible and are completely surrounded by CdS powder; commercial grade cadmium sulfide is preferred for this purpose, although cadmium selenide powder may be used instead. The crucible is then placed in an oven which has been preheated to approximately 600° C.; the temperature in the oven is immediately raised to the sintering range of 650 to 750° C. The sintering temperature should be maintained within a 10 to 20° C. tolerance range throughout the sintering process; usually, the optimum temperature is approximately 710° C. Because the most satisfactory temperature range is dependent upon the type of oven used and the type of packing employed for the crucible, it should be determined empirically for each individual manufacturing set-up. The firing time for sintering is also dependent upon the size of the crucible and the amount of CdS packing; in general, the firing time may be of the order of one-half to two or more hours.

*Cooling* (*step 15*)

At the end of sintering or firing step 14, the crucible containing the glass substrate to which the CdS has been sintered is immediately removed from the oven and allowed to cool in air at ambient temperature. This cooling procedure is not critical and may be accelerated by moderate additional cooling procedures such as blowing cool air across the sintered material.

*Preparation of* CdSe *suspension* (*steps 16 and 17*)

The CdSe suspension is prepared from a commercial grade precipitated CdSe powder. This material is available from E. I. Du Pont De Nemours & Company. Like the CdS suspension, sufficient water should be included to insure the right consistency for the application techniques selected. Approximately the desired working consistency for brush painting may be obtained with about 2 cc. of water per gram of CdSe powder, but this may be varied to provide the best consistency for any given coating technique.

The initial cadmium selenide material contains a substantial quantity of donor impurities and may require the addition of inhibitor impurities as noted above. If copper is selected as the inhibitor, it may be added to the CdSe in the form of copper sulfate or any other soluble or semi-soluble copper salt. It may also be necessary to add additional quantities of the donor impurities; these may conveniently be added in the form of cupric chloride or some other halide. A typical modified suspension contains approximately $1\times10^{-3}$ gram chlorine per gram CdSe and $1\times10^{-3}$ gram copper per gram CdSe.

*Coating of sintered* CdS *coating* (*steps 18 and 19*)

The suspension prepared as indicated in steps 16 and 17 is applied with a paint brush to the previously sintered CdS coating in a strip approximately 5 millimeters wide extending completely across the exposed surface of the CdS layer. After the CdSe coating has been applied, the discs are dried in air at approximately 100° C. and are then ready for the final sintering step. The drying temperature is not critical.

*Sintering of* CdSe *coating* (*step 20*)

The firing process employed to sinter the CdSe coating to the previously sintered CdS coating may be the same as that employed for the latter coating. While the atmosphere may be governed by the presence of additional CdS powder, it is preferred to use CdSe for this purpose. As before, the firing crucible, containing the now double-coated discs, is placed in an oven which has been preheated to approximately 600° C.; the temperature in the oven is immediately raised to the sintering range of 700 to 800° C. The sintering temperature is quite critical and must be maintained within a 10 to 20° C. tolerance range throughout the sintering process; usually, the optimum temperature is approximately 750° C. Because, as before, the critical temperature range is dependent upon the type of oven used and the type of packing employed for the crucible, it should be determined empirically for each individual manufacturing set-up. The firing time for sintering is also dependent upon the size of the crucible and the amount of packing; in general, the firing time may be of the order of one-half to two or more hours. It should be noted that, although this time may vary substantially for different types of processing equipment, it is relatively critical, since sensitivity, dark conductivity, and decay time of the cells all increase with increases in firing time. Accordingly, trial runs should be made for any given processing equipment to determine the optimum firing time to achieve a proper balance between these factors.

*Cooling and application of electrodes (step 21)*

At the end of sintering or firing step 20, the crucible containing the glass subtrate to which the CdS and CdSe have successively been sintered is immediately removed from the oven and allowed to cool in air at ambient temperature. This cooling procedure is not critical and may be accelerated by moderate additional cooling procedures such as blowing cool air across the sintered material. After cooling, the double coated discs are removed from the crucible and electrodes are applied to the sintered CdSe coating by painting two separated areas of the CdSe coating and the adjacent areas of the CdS coating and the substrate with an air-drying silver paste; a suitable silver paste for this purpose is manufactured by the E. I. Du Pont De Nemours & Company and identified by that company as No. 4817. The two electrodes are separated by a gap of approximately one millimeter; the gap extends completely across the disc and consequently has a length of approximately 10.4 millimeters. It should be noted that the sensitivity of the photoconductive cell formed by the two electrodes and the photoconductive material connecting them is proportional to the length of the gap separating the two electrodes and inversely proportional to the square of the width of that gap; thus, the sensitivity of a cell may be varied by adjusting the width of the electrode gap. The electrode coating is then dried; air-drying may be utilized or, if desired, the drying may be accelerated by the use of infrared lamps, a relatively low-temperature bake out, or other suitable techniques.

*Lead connections and housing*

After the electrodes have been applied to the cell (step 21), the cells are ready for use. Obviously, however, they require protection from rough handling, etc. Generally speaking, it is not feasible to connect leads to the cell electrodes by soldering or other similar techniques, since the relatively thin conductive electrode layers may easily be destroyed by such a procedure and the photoconductive layer may also be disturbed or its photoconductive properties substantially altered. Accordingly the cell should be encased in a housing which permits illumination of the photoconductor exposed through the gap between the two electrodes but which provides adequate protection against mechanical damage. It is also preferred that the housing be hermetically sealed, since the cells tend to deteriorate under even moderate humidity conditions. The specific form of casing employed is not critical; a preferred housing and lead structure is described hereinafter in connection with Figures 3 and 4.

Figure 2 illustrates a typical crucible structure which may be employed in sintering the CdS coating to the glass substrate and in sintering the CdSe to the CdS coating. The crucible structure comprises a small heat-resistant glass vial 30 having an inside diameter slightly larger than the diameter of the coated glass discs of the cells. In preparing the vial for use in the firing or sintering procedure, a ceramic (for instance an aluminum oxide or steatite ceramic) disc 31 is first placed in the bottom of vial 30. In carrying out step 14, a first glass disc 32 is then placed in vial 30 on top of ceramic disc 31 with the CdS coating 33 on the glass disc facing upwardly. A second ceramic wafer 34 is then placed on top of disc 32, followed by another coated glass disc 35. Further ceramic discs and coated glass discs are deposited in the vial in the same sequence. The last disc is a ceramic wafer 36. A cover 37 of heat-resistant glass or quartz covers the vial 30.

For processing, vial 30 is positioned within a quartz crucible 38 filled with commercial grade CdS powder 39 and covered by a quartz lid 40. The simplest method of emplacing the vial in the illustrated position is to deposit a layer of CdS in crucible 38, place the already-loaded vial 30 on top of the CdS layer, and then fill the remainder of the crucible with CdS powder. The ceramic discs are employed to prevent sintering of the coated glass discs to each other and may be re-used many times. As indicated in the foregoing description of the sintering process, the cricible arrangement of Figure 2 permits the sintering process to be carried out in an atmosphere substantially predominated by the CdS powder and provides for maximum uniformity in the characteristics of the finished cells.

Step 20, in which the CdSe is sintered onto the previously sintered CdS, is carried out in substantially the same way as step 14. While Cds may be employed for controlling the firing atmosphere, powder 39 in this case preferably is commercial grade CdSe. Thus, a first glass disc 32 is placed in vial 30 on top of ceramic disc 31 with the contiguous CdS and CdSe coatings on the glass disc facing upwardly. Second ceramic wafer 34 is then placed on top of disc 32, followed by another double-coated glass disc 35. Further ceramic discs and double-coated glass discs are deposited in the vial in the same sequence. The last disc is ceramic wafer 36. As before, cover 37 covers vial 30.

Vial 30 is then positioned within crucible 38 filled with the commercial grade CdSe powder and covered by lid 40. Thus, the crucible arrangement of Figure 2 permits the sintering of the CdSe to be carried out in an atmosphere substantially predominated by the CdSe powder and provides for maximum uniformity in the characteristics of the finished cells.

Figure 3:
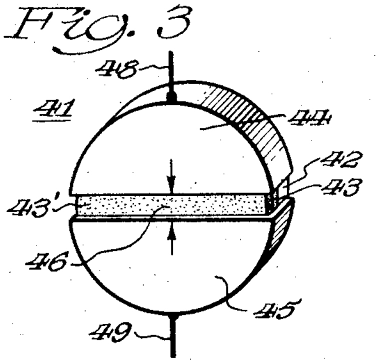
Figure 3 illustrates one cell structure, independent of housing, for a sintered photoconductive cell constructed in accordance with the invention.

Figure 3 shows one form of completed photocell without a housing. The photocell 41 comprises a glass disc 42 which serves as a substrate for the sintered CdS coating 43 upon which is sintered the CdSe coating 43'. The two electrodes 44 and 45 are separated by a gap 46 which, as indicated above, is approximately one millimeter in width and extends across the full diameter of the disc. Electrical connection to the photocell is provided by two leads 48 and 49 which are individually electrically connected to electrodes 44 and 45 respectively, the leads being shown schematically in this view. In operation, the photocell illustrated in Figure 3 is connected as an impedance in a circuit in which it is desired to control the circuit resistance in response to incident radiation. Illumination of that portion of coating 43' exposed through gap 46 causes the electrical resistance between electrodes 44 and 45 to vary and thus permits control of the circuit characteristics.

Figure 4:
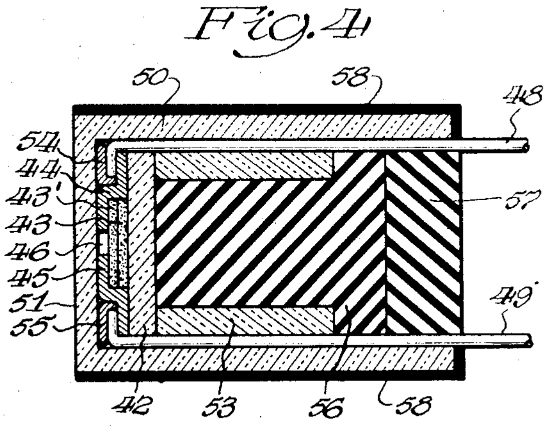
Figure 4 illustrates a preferred form of housing for the cell of Figure 3.

Figure 4 is a cross-sectional view of a preferred form of housing for photocell 41 and shows the basic cell structure comprising glass disc 42, coatings 43 and 43′ and the electrodes 44 and 45 mounted within a cup-shaped casing 50 with gap 46 facing the base portion 51 of the casing. Portion 51 of casing 50 should be highly transparent; the entire casing may be conveniently formed by machining from a rod of polymerized methyl methacrylate, polystyrene or other suitable transparent plastic material. The leads 48 and 49 for the cell are each bent at one end and are mounted in slots in a retaining cylinder 53 and are pressed into contact with electrodes 44 and 45. Good electrical contact is assured by the use of silver paste or other conductive cement at the electrode lead junctions, as indicated by numerals 54 and 55. Cylinder 53 is preferably filled with wax and the wax filling 56 is extended beyond the cylinder to seal the cylinder into casing 50. A heat-resistant wax plug 57 may be employed to cap filler 56. Throughout all the enumerated operations particular care must be taken to work under moisture free conditions. Thus the silver paste contacts must be thoroughly dried by at least one hour storage in a heated cabinet; the glass vials should preferably be preheated; it is advantageous to perform all cited operations in a specially dehumidified chamber. The sidewalls and base of the housing are coated with a non-conductive opaque coating 58.

Figure 5:
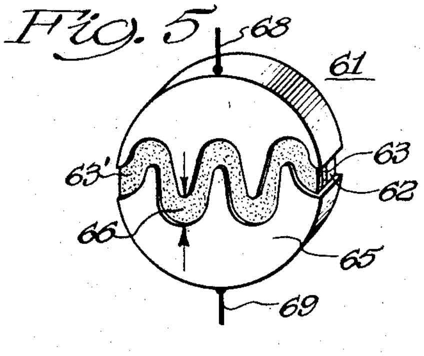
Figure 5 illustrates a preferred form of photocell structure.

As noted in connection with the description of step 21 of Figure 1, the sensitivity of the photocell is directly proportional to the length of the gap between its electrodes. In some applications, it is highly desirable to increase the sensitivity by increasing the gap length without enlarging the overall size of the photocell. A preferred structure in which this objective is accomplished is illustrated in Figure 5. The photocell 61 shown in Figure 6 comprises a glass disc 62 which serves as a substrate for a sintered CdS coating 63 upon which is sintered a CdSe coating 63′. The photocell further includes two electrodes 64 and 65 provided with individual leads 68 and 69 respectively. In this construction, however, the simple linear gap 46 of Figure 4 is not employed; rather, a meandering gap 66 is formed between electrodes 64 and 65. Of course, it would be extremely difficult to form a constant-width gap of this configuration by hand painting. It is possible, however, to achieve the desired gap configuration by applying electrodes 64 and 65 to the CdSe coating by silk screening or similar techniques using a graphite suspension in alcohol known under the commercial tradename of "Neolube." With silk screening, the width of gap 66 may be precisely controlled and the illustrated configuration may be employed to increase the gap length very substantially as compared to the simpler configuration of Figure 3, thus effectively providing materially increased sensitivity in a cell without requiring a corresponding increase in cell dimensions.

Figure 6:
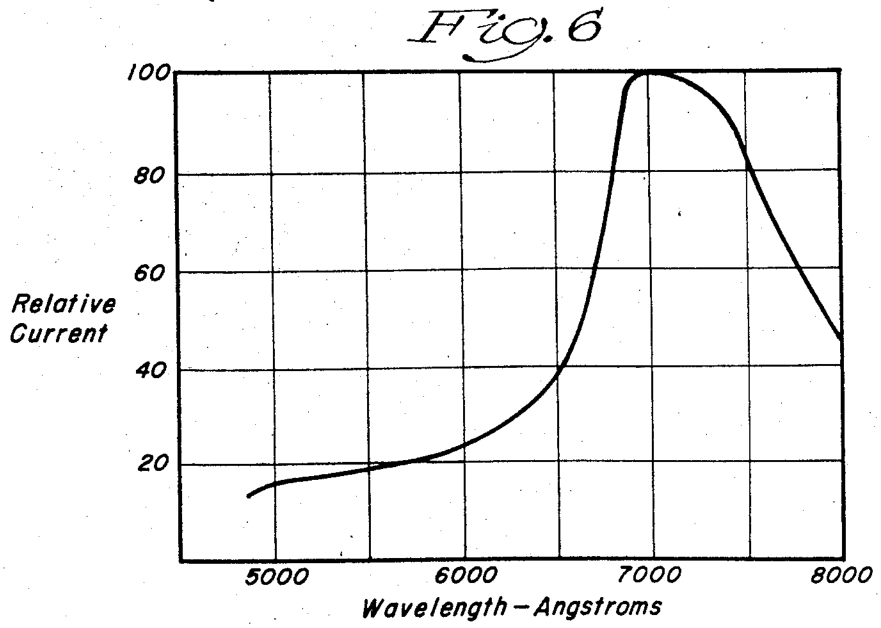
Figure 6 illustrates the spectral response characteristics of a cell produced in accordance with the invention.

In Figure 6, the percentage of maximum current translated by a typical photocell manufactured in accordance with the specific technique described above and utilizing the structure of Figure 5 is plotted as a function of the wavelength of incident radiation to illustrate the spectral response characteristics of the cell. This response characteristic, curve 73, shows a sharp response peak at approximatelly 7000 Angstroms, which is typical of most CdSe cells, whether of the evaporated, single-crystal, or sintered types. Thus, these cells have a relatively higher response in the red portion of the spectrum than in the blue portion. The cadmium selenide cells also exhibit useful response characteristics at the lower infra-red wavelengths, so that they may be actuated by infra-red radiations where desired. Sensitivity of the CdSe cells is comparable to that of the sintered CdS cells described in the aforementioned Pakswer et al. application; they are also similar to the CdS cells of that application in their decay-time characteristics, except that decay time on the CdSe cells is usually shorter. Consequently, the CdSe cells are preferable for applications in which speed of response is an important factor.

It will thus be appreciated that photosensitive devices manufactured in accordance with the invention are relatively simple and inexpensive to manufacture. The inventive method yields devices which are comparatively stable in sensitivity and in their unilluminated impedance. Furthermore, the resultant sensitivity of the devices is subject to very accurate control, and the resultant spectral response is generally within the red portion of the spectrum. More particularly, the invention permits forming a photosensitive device in which cadmium selenide photoconductor may be sintered onto a support which includes a material of comparatively low melting point, such as glass.

While a particular embodiment of the present invention has been shown and described, it is apparent that numerous variations and modifications may be made, and it is therefore contemplated in the appended claims to cover all such variations and modifications as fall within the true spirit and scope of the invention.

I claim:

1. The method of manufacturing photosensitive impedance devices comprising the following steps: coating a substrate with a material consisting essentially of cadmium sulfide; firing said coated substrate at a temperature above 650° C. for a time sufficient to sinter said material to said substrate; coating said sintered material with a photoconductor consisting essentially of cadmium selenide; firing said cadmium-selenide-coated material at a temperature above 650° C. for a time sufficient to sinter said photoconductor to said material and to develop photoconductive properties in said cadmium selenide coating; and applying two spaced conductive elements to said cadmium selenide coating to form a pair of electrodes electrically interconnected by said sintered cadmium selenide.

2. The method of manufacturing photosensitive impedance devices comprising the following steps: coating a substrate with a material consisting essentially of cadmium sulfide; firing said coated substrate at a temperature above 650° C. for a time sufficient to sinter said material to said substrate; coating said sintered material with a photoconductor consisting essentially of cadmium selenide and including minor portions of a donor element selected from the group consisting of elements from the third and seventh columns of the periodic table and an inhibitor element selected from the group consisting of copper, silver and manganese; firing said cadmium-selenide-coated material at a temperature above 650° C. for a time sufficient to sinter said photoconductor to said material and to develop photoconductive properties in said cadmium selenide coating; and applyiing two spaced conductive elements to said cadmium selenide coating to form a pair of electrodes electrically interconnected by said sintered cadmium selenide.

3. The method of manufacturing photosensitive impedance devices comprising the following steps: coating a substrate with a material consisting essentially of cadmium sulfide; firing said coated substrate in an atmosphere containing at least one of the elements sulfur and selenium at a temperature above 650° C. for a time sufficient to sinter said material to said substrate; coating said sintered material with a photoconductor consisting essentially of cadmium selenide; firing said cadmium-selenide-coated material in an atmosphere containing at least one of said elements at a temperature above 650° C. for a time sufficient to sinter said photoconductor to said material and to develop photoconductive properties in said cadmium selenide coating; and applying two spaced conductive elements to said cadmium selenide coating to form a pair of electrodes electrically interconnected by said sintered cadmium selenide.

4. The method of manufacturing photosensitive impedance devices comprising the following steps: coating a substrate with a material consisting essentially of cadmium sulfide; firing said coated substrate in an atmosphere containing sulfur at a temperature above 650° C. for a time sufficient to sinter said material to said substrate; coating said sintered material with a photoconductor consisting essentially of cadmium selenide; firing said cadmium-selenide-coated material in an atmosphere containing selenium at a temperature above 650° C. for a time sufficient to sinter said photoconductor to said material and to develop photoconductive properties in said cadmium selenide coating; and applying two spaced conductive elements to said cadmium selenide coating to form a pair of electrodes electrically interconnected by said sintered cadmium selenide.

5. The method of manufacturing photosensitive impedance devices comprising the following steps: coating a substrate with a material consisting essentially of cadmium sulfide; firing said coated substrate in an atmosphere containing at least one of the elements sulfur and selenium at a temperature of approximately 710° C. for a period of one-half to two hours to sinter said material to said substrate; coating said sintered material with a photoconductor consisting essentially of cadmium selenide; firing said cadmium-selenide-coated material in an atmosphere containing at least one of said elements at a temperature of approximately 750° C. for a period of one-half to two hours to sinter said photoconductor to said material and to develop photoconductive properties in said cadmium selenide coating, and applying two spaced conductive elements to said cadmium selenide coating to form a pair of electrodes electrically interconnected by said sintered cadmium selenide.

6. The method of manufacturing photosensitive impedance devices comprising the following steps: coating a substrate with a material consisting essentially of cadmium sulfide; firing said coated substrate in an atmosphere containing at least one of the elements sulfur and selenium at a temperature within the range of 650–750° C. for a time sufficient to sinter said material to said substrate; coating said sintered material with a photoconductor consisting essentially of cadmium selenide; firing said cadmium-selenide-coated material in an atmosphere containing at least one of said elements at a temperature within the range of 700–800° C. for a time sufficient to sinter said photoconductor to said material and to develop photoconductive properties in said cadmium selenide coating; and applying two spaced conductive elements to said cadmium selenide coating to form a pair of electrodes electrically interconnected by said sintered cadmium selenide.

7. The method of manufacturing photosensitive impedance devices comprising the following steps: coating a substrate with a material consisting essentially of cadmium sulfide; firing said coated substrate in an atmosphere containing at least one of the elements sulfur and selenium at a temperature above 650° C. for a time sufficient to sinter said material to said substrate; coating said sintered material with a photoconductor consisting essentially of cadmium selenide and including minor portions of a donor element selected from the group consisting of elements from the third and seventh columns of the periodic table and an inhibitor element selected from the group consisting of copper, silver and manganese; firing said cadmium-selenide-coated material in an atmosphere containing at least one of said elements at a temperature above 650° C. for a time sufficient to sinter said photoconductor to said material and to develop photoconductive properties in said cadmium selenide coating; and applying two spaced conductive elements to said cadmium selenide coating to form a pair of electrodes electrically interconnected by said sintered cadmium selenide.

8. The method of manufacturing photosensitive impedance devices comprising the following steps: coating a substrate with a material consisting essentially of cadmium sulfide; firing said coated substrate in an atmosphere containing at least one of the elements sulfur and selenium at a temperature of approximately 710° C. for one-half to two hours to sinter said material to said substrate; coating said sintered material with a photoconductor consisting essentially of cadmium selenide and including minor portions of a donor element selected from the group consisting of elements from the third and seventh columns of the periodic table and an inhibitor element selected from the group consisting of copper, silver and manganese; firing said cadmium-selenide-coated material in an atmosphere containing at least one of said elements at a temperature of approximately 750° C. for one-half to two hours to sinter said photoconductor to said material and to develop photoconductive properties in said cadmium selenide coating; and applying two spaced conductive elements to said cadmium selenide coating to form a pair of electrodes electrically interconnected by said sintered cadmium selenide.

9. The method of manufacturing photosensitive impedance devices comprising the following steps: coating a substrate with a material consisting essentially of cadmium sulfide; firing said coated substrate in an atmosphere containing at least one of the elements sulfur and selenium at a temperature above 650° C. for a time sufficient to sinter said material to said substrate; coating said sintered material with a photoconductor consisting essentially of cadmium selenide and including chlorine and copper at concentrations of the order of $1 \times 10^{-3}$ gram per gram cadmium selenide; firing said cadmium-selenide-coated material in an atmosphere containing at least one of said elements at a temperature above 650° C. for a time sufficient to sinter said photoconductor to said material and to develop photoconductive properties in said cadmium selenide coating; and applying two spaced conductive elements to said cadmium selenide coating to form a pair of electrodes electrically interconnected by said sintered cadmium selenide.

10. The method of manufacturing photosensitive impedance devices comprising the following steps: coating a substrate with a material consisting essentially of cadmium sulfide; firing said coated substrate in an atmosphere containing sulfur at a temperature above 650° C. for a time sufficient to sinter said material to said substrate; coating said sintered material with a photoconductor consisting essentiall of cadmium selenide and including minor portions of a donor element selected from the group consisting of elements from the third and seventh columns of the periodic table and an inhibitor element selected from the group consisting of copper, siliver and manganese; firing said cadmium-selenide-coated material in an atmosphere containing selenium at a temperature above 650° C. for a time sufficient to sinter said photoconductor to said material and to develop photoconductive properties in said cadmium selenide coating; and applying two spaced conductive elements to said cadmium selenide coating to form a pair of electrodes electrically interconnected by said sintered cadmium selenide.

11. A photosensitive impedance device comprising: an electrically insulating substrate; a coating of material consisting essentially of cadmium sulfide, sintered to said substrate; a photoconductive coating, consisting essentially of cadmium selenide, sintered to said material; and a pair of spaced conductive electrodes in electrical contact with said sintered cadmium selenide coating.

12. A photosensitive impedance device comprising: an electrically insulating substrate; a coating of material, consisting essentially of cadmium sulfide, sintered to said substrate; a photoconductive coating, consisting essentially of cadmium selenide and including minor portions of a donor element and an inhibitor element, sintered to said material; and a pair of spaced conductive electrodes in electrical contact with said sintered-cadmium-selenide coating.

13. A photosensitive impedance device comprising: an electrically insulating substrate; a coating of material consisting essentially of cadmium sulfide, sintered to said substrate; a photoconductive coating, consisting essentially of cadmium selenide and including chlorine and copper at concentrations of the order of $1\times10^{-3}$ gram per gram cadmium selenide, sintered to said material; and a pair of spaced conductive electrodes in electrical contact with said sintered cadmium selenide coating.

References Cited in the file of this patent

UNITED STATES PATENTS

| | | |
|---|---|---|
| 2,688,564 | Forgue | Sept. 7, 1954 |
| 2,765,385 | Thomsen | Oct. 2, 1956 |